(12) United States Patent
De Carolis et al.

(10) Patent No.: US 11,683,901 B2
(45) Date of Patent: Jun. 20, 2023

(54) MODULAR ELECTRICAL FIELDBUS SYSTEM WITH STACKED INTERCONNECTED FUNCTIONAL COMPONENTS

(71) Applicant: Asco, L.P., Novi, MI (US)

(72) Inventors: Enrico De Carolis, Oakland Township, MI (US); Scott Heriot, Phoenix, AZ (US); Mitch Frazier, Chandler, AZ (US)

(73) Assignee: ASCO, L.P., Novi, MI (US)

( * ) Notice: Subject to any disclaimer, the term of this patent is extended or adjusted under 35 U.S.C. 154(b) by 657 days.

(21) Appl. No.: 16/609,945

(22) PCT Filed: May 2, 2017

(86) PCT No.: PCT/US2017/030594
§ 371 (c)(1),
(2) Date: Oct. 31, 2019

(87) PCT Pub. No.: WO2018/203883
PCT Pub. Date: Nov. 8, 2018

(65) Prior Publication Data
US 2020/0060039 A1    Feb. 20, 2020

(51) Int. Cl.
*H01R 33/88* (2006.01)
*H01R 33/90* (2006.01)
(Continued)

(52) U.S. Cl.
CPC ........... *H05K 7/1472* (2013.01); *H01R 33/88* (2013.01); *H01R 33/90* (2013.01); *H01R 33/94* (2013.01); *H05K 7/1478* (2013.01)

(58) Field of Classification Search
CPC ............ G05B 19/0423; H01R 13/6215; H01R 9/2616; H01R 9/2675; H01R 9/22;
(Continued)

(56) References Cited

U.S. PATENT DOCUMENTS

| 5,601,415 A | 2/1997 | Nagai et al. |
| 5,884,664 A | 3/1999 | Nagai et al. |

(Continued)

FOREIGN PATENT DOCUMENTS

| DE | 102005048646 B3 | 2/2007 |
| DE | 102007009677 A1 | 9/2008 |

(Continued)

OTHER PUBLICATIONS

Aventics G3 Series Wireless ARM Module_pp. 1-19_Mar. 2021.*
(Continued)

*Primary Examiner* — Timothy J Thompson
*Assistant Examiner* — Guillermo J Egoavil
(74) *Attorney, Agent, or Firm* — Harness, Dickey & Pierce, P.L.C.

(57) ABSTRACT

A modular electrical bus system for a valve manifold has a communication module, a valve driver module, and a plurality of I/O modules each having a plurality of I/O fittings being both electrically and mechanically connectable together via a bridge member connecting adjacent modules. The bridge member has a housing with an interior for housing electronic components for memory storage or Wi-fi reception and transmission that is operably connected to a complementary electrical fitting constructed to be connected to an electrical fitting of a module of said electrical fieldbus system without adding extra length to said bank of modules of said electrical fieldbus system.

19 Claims, 6 Drawing Sheets

(51) Int. Cl.
*H01R 33/94* (2006.01)
*H05K 7/14* (2006.01)

(58) Field of Classification Search
CPC .... H01R 9/2408; H01R 9/2491; H01R 33/88;
H01R 33/90; H01R 33/94; H01R
2201/04; H05K 7/1472; H05K 7/1478;
H05K 7/14; H05K 7/1479
USPC .................. 361/728; 715/771, 810; 710/305
See application file for complete search history.

(56) References Cited

U.S. PATENT DOCUMENTS

| | | | |
|---|---|---|---|
| 6,581,619 B1 | 6/2003 | Christiani et al. | |
| 6,634,910 B2 | 10/2003 | Lieb et al. | |
| 6,848,933 B1 | 2/2005 | Delaney, III et al. | |
| 7,581,053 B2 | 8/2009 | Sichner et al. | |
| 7,636,615 B2 | 12/2009 | Pfingsten et al. | |
| 7,753,740 B2 | 7/2010 | De Carolis et al. | |
| 7,896,711 B2 | 3/2011 | De Carolis et al. | |
| 7,926,409 B2 | 4/2011 | Arbter et al. | |
| 7,967,646 B2 | 6/2011 | De Carolis et al. | |
| 8,209,455 B2 | 6/2012 | Rasche et al. | |
| 8,219,253 B2 | 7/2012 | Arbter et al. | |
| 8,266,902 B2 | 9/2012 | Nolle et al. | |
| 8,332,179 B2 | 12/2012 | Nolle et al. | |
| 8,332,567 B2 | 12/2012 | Burr et al. | |
| 8,374,094 B2 | 2/2013 | Law et al. | |
| 8,800,879 B2 | 8/2014 | Fischer | |
| 8,929,948 B2 | 1/2015 | Vanderaa et al. | |
| 9,055,687 B2 | 6/2015 | Molnar et al. | |
| 9,230,765 B2 | 1/2016 | Baran et al. | |
| 2004/0051381 A1 | 3/2004 | Garner et al. | |
| 2010/0251159 A1* | 9/2010 | De Carolis | H04L 12/40006 715/810 |
| 2012/0243190 A1 | 9/2012 | Correll et al. | |
| 2015/0195944 A1* | 7/2015 | Bury | H05K 7/1472 361/622 |
| 2015/0372753 A1* | 12/2015 | Jovicic | H05B 45/12 398/172 |
| 2016/0170922 A1* | 6/2016 | Rose | G05B 19/054 710/305 |
| 2016/0173970 A1* | 6/2016 | Kalyvas | H04M 1/6041 455/569.1 |
| 2016/0226162 A1 | 8/2016 | Erni | |
| 2017/0356475 A1* | 12/2017 | Hamm | F15B 20/002 |
| 2021/0019138 A1* | 1/2021 | Gorka | G05B 19/0426 |

FOREIGN PATENT DOCUMENTS

| | | | |
|---|---|---|---|
| DE | 102015111370 B3 | 12/2016 | |
| EP | 1775479 A2 | 4/2007 | |
| EP | 1881249 A1 | 1/2008 | |
| EP | 1965084 A1 | 9/2008 | |
| EP | 2212600 A1 | 8/2010 | |
| EP | 2217811 A1 | 8/2010 | |
| EP | 2224139 A2 | 9/2010 | |
| EP | 2322809 A1 | 5/2011 | |
| FR | 2776844 A3 * | 10/1999 | .......... G02B 6/3878 |
| WO | WO2008104260 A1 | 9/2008 | |
| WO | WO-2009030243 A1 | 3/2009 | |

OTHER PUBLICATIONS

Fieldbus control platforms_pp. 1-2_Feb. 2016.*
G3 Series DeviceNet Technical Manual_pp. 1-82_Feb. 2009.*
WLAN vs Wi-Fi_pp. 1-2_Jan. 2017.*
International Search Report for PCT/US2017/030594 dated Aug. 1, 2017 (2 pages).
G3 Series DeviceNet Technical Manual, www.numatics.com/g3, TDG3DNTM1-0EN, Feb. 2009, 82 pages.

* cited by examiner

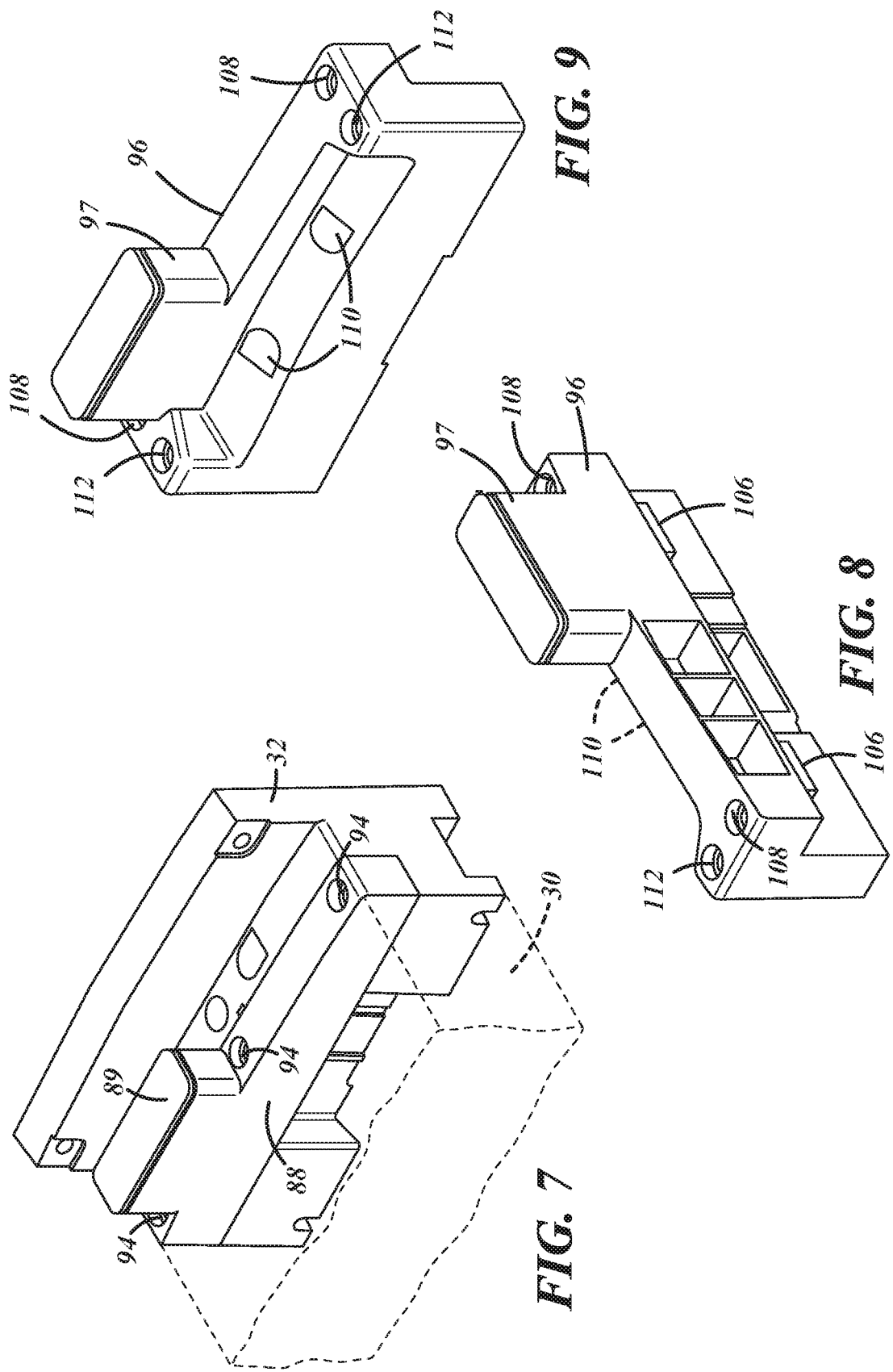

MODULAR ELECTRICAL FIELDBUS SYSTEM WITH STACKED INTERCONNECTED FUNCTIONAL COMPONENTS

TECHNICAL FIELD

The field of this invention relates to electrical fieldbus systems that can be used with pneumatic valve manifolds.

BACKGROUND OF THE DISCLOSURE

Industrial automation uses many control devices. One useful control device combines electrical actuated solenoids that control the direction of hydraulic or pneumatic flow for operating other downstream devices. In recent times these valves have been controlled by industrial network protocols often referred to as fieldbuses whose communication modules are often mounted adjacent the valve manifold.

Modular fieldbus components with input-output (I/O) modules and a bank of valve modules are popular for various reasons. Additional I/O components can be added on as the need arises. Furthermore, an I/O module or valve component when it malfunctions can be easily replaced without replacing the entire bank of components.

Other optional components that provide functions often referred to as smart or intelligent components, for example, auto-recovery modules or wireless local area network (hereinafter "wi-fi") modules can also be added on afterwards to provide additional functions and features to the manifold bank. The addition of such optional modules, is only limited by the space available, e.g. the length of the mounting bracket on which the modules are mounted or other cabinet spatial constraints. In other words, the mounting track, commonly a DIN rail, has a limited length and often the original planning for installation of the mounting track only considered the originally planned I/O modules and valve stations. The original plans may not have provided room for additional components such as extra valve modules, extra I/O units or other functional components such as wi-fi transmission components or other functional or smart and intelligent components.

Certain modular banks have their modules mechanically interconnected together via bridge elements. In addition, these bridge elements also electrically connect one modular unit to another through an electrical fittings and wiring through the bridge element. The electrical wiring in the bridge elements are passive in nature and only provides electrical communication. In other words the bridge elements add no additional intelligent functions.

What is needed is a modular electrical bus system with optional components that are packaged onto the original modules in a stackable fashion to provide added active smart and intelligent functions beyond the mere passing of electric current from one fitting to another fitting but without increasing the length of the module field bus bank. What is also desired is a modular fieldbus system that can replace a passive bridge element that is used to connect two modules together with another functional module that also connects the two modules together.

SUMMARY OF THE DISCLOSURE

In accordance with one aspect of the invention a modular electrical fieldbus system for a valve manifold has a bank of modules mounted adjacent each other. The modules have a respective electrical fitting in proximity to each side thereof for electrically connecting two adjacent modules together. At least one bridge member spans and electrically and mechanically connects at least two modules adjacent each other together. Each bridge member has complementary electrical fittings for engaging the electrical fittings of the two adjacent modules. The bridge member also mechanically connects, preferably by receiving fasteners, the two adjacent modules together. A functional modular member with an internal functional smart or intelligent device therein replaces a bridge member or an end plate and has a complementary electrical fitting for connecting to at least one of the electrical fittings on at least one of the modules to attach the smart device to the bank of modules without increasing the length of the bank of modules.

Preferably, the functional modular member has a plurality of complementary electrical fittings for fitting with a respective electrical fitting of two adjacent modules and has apertures to receive fasteners that engage and mechanically fasten the two adjacent modules together. In one embodiment the functional modular member has a wireless gateway operably mounted therein and operably connected to the complementary electrical fittings for receiving electrical communication therefrom and wirelessly transmitting electrical communication to a remote receiving device and for transmitting electrical communication to the complementary electrical fittings received from a remote wireless transmitting device. In another embodiment, the functional modular member is an automatic recovery module with non-volatile computer memory for connection to electrical fittings of a communication module and a valve drive module.

Preferably, each module has a side with a first extension. Each module also has an opposite side with another extension with a complementary interlocking cavity. The functional modular member is a bridge member placed and aligned directly in front of two adjacent modules and the respective interlocking extensions and interlocking cavity and secured thereto to mechanically connect said two adjacent modules together.

Preferably, the modules have their respective first extension and another oppositely positioned extension with recessed front faces with respect to a main face of the module. The extensions house the electrical fittings that are interposed laterally between two main faces of two adjacent module units. The functional modular member fits in a gap formed directly in front of the recessed front faces between the main faces of two adjacent modules to mechanically connect and affix to both of the adjacent modules and positioned directly in front of the recessed front faces of the extensions.

According to another aspect of the invention, an electrical fieldbus assembly has a first module and a second module that are juxtaposed against each other and having opposing sides with complementary shaped sections to interlock together along a plane. A bridge member is mountable on the first and second module directly in front of complementary shaped sections to fasten and connect the adjacent modules together in a direction perpendicular to the plane. The modules and the bridge member have complementary electrical fittings to electrically connect adjacent modules together through the bridge member. The bridge member has at least one of non-volatile memory and wi-fi transmitting and receiving devices mounted in its interiors and operably connected to the complementary electrical fittings.

Preferably, the first and second modules are juxtaposed adjacent each other. The modules have side extensions with recessed front faces with respect to a main face of the respective modules. The side extensions house electrical fittings that are interposed between two main faces of two adjacent modules. The bridge member fits in a gap formed in front of the recessed front faces between the main faces of two adjacent modules to mechanically connect and affix to both of the adjacent modules. Preferably, each bridge member has complementary electrical fittings to connect to the electrical fitting of the two adjacent modules to electrically connect the two adjacent modules.

According to another aspect of the invention, a functional module for a bank of modules in an electrical fieldbus system has a housing with an interior for housing smart electronic components preferably for memory storage or wi-fi reception and transmission that is operably connected to a complementary electrical fitting constructed to be connected to an electrical fitting of a module of said electrical fieldbus system without adding extra length to said bank of modules of said electrical fieldbus system. Preferably, the complementary electrical fitting extends from a bottom of the functional module for connection to the electrical fitting of the module that is on a front surface of the module.

BRIEF DESCRIPTION OF THE DRAWINGS

Reference now is made to the accompanying drawings in which:

FIG. 7 is a perspective view of the ARM clip installed on the valve drive member and communication module with the communication module shown in phantom for clarity of the illustration;

FIG. 8 is an enlarged perspective view of the wireless wi-fi end plate module according to an embodiment of the invention;

FIG. 9 is another perspective view of the wireless wi-fi end plate module shown in FIG. 8;

DETAILED DESCRIPTION OF THE PREFERRED EMBODIMENT

Figure 1:
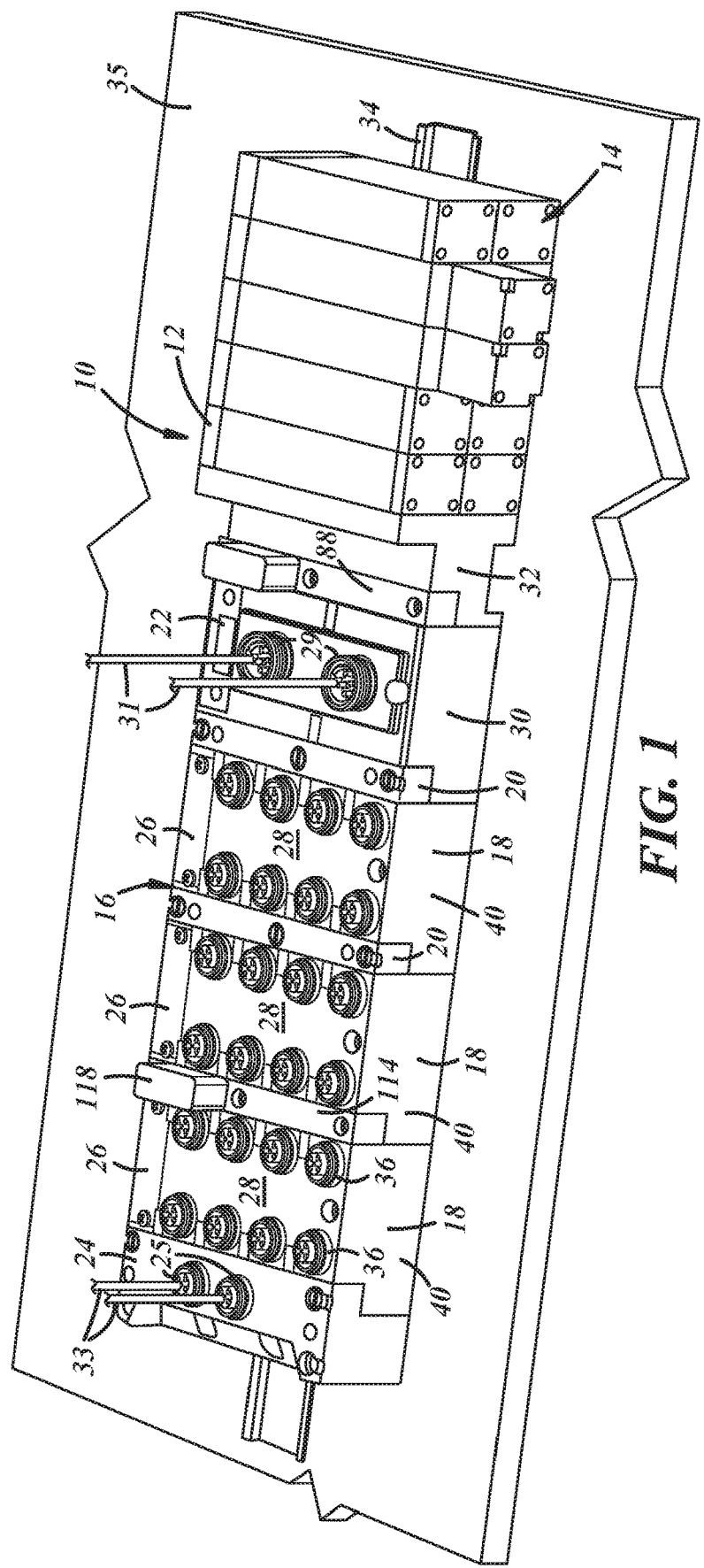
FIG. 1 is a perspective of one arrangement according to an embodiment of the invention shown with a bank of three I/O modules, a communication module and an optional sub-bus module attached to a valve manifold.
Figure 2:
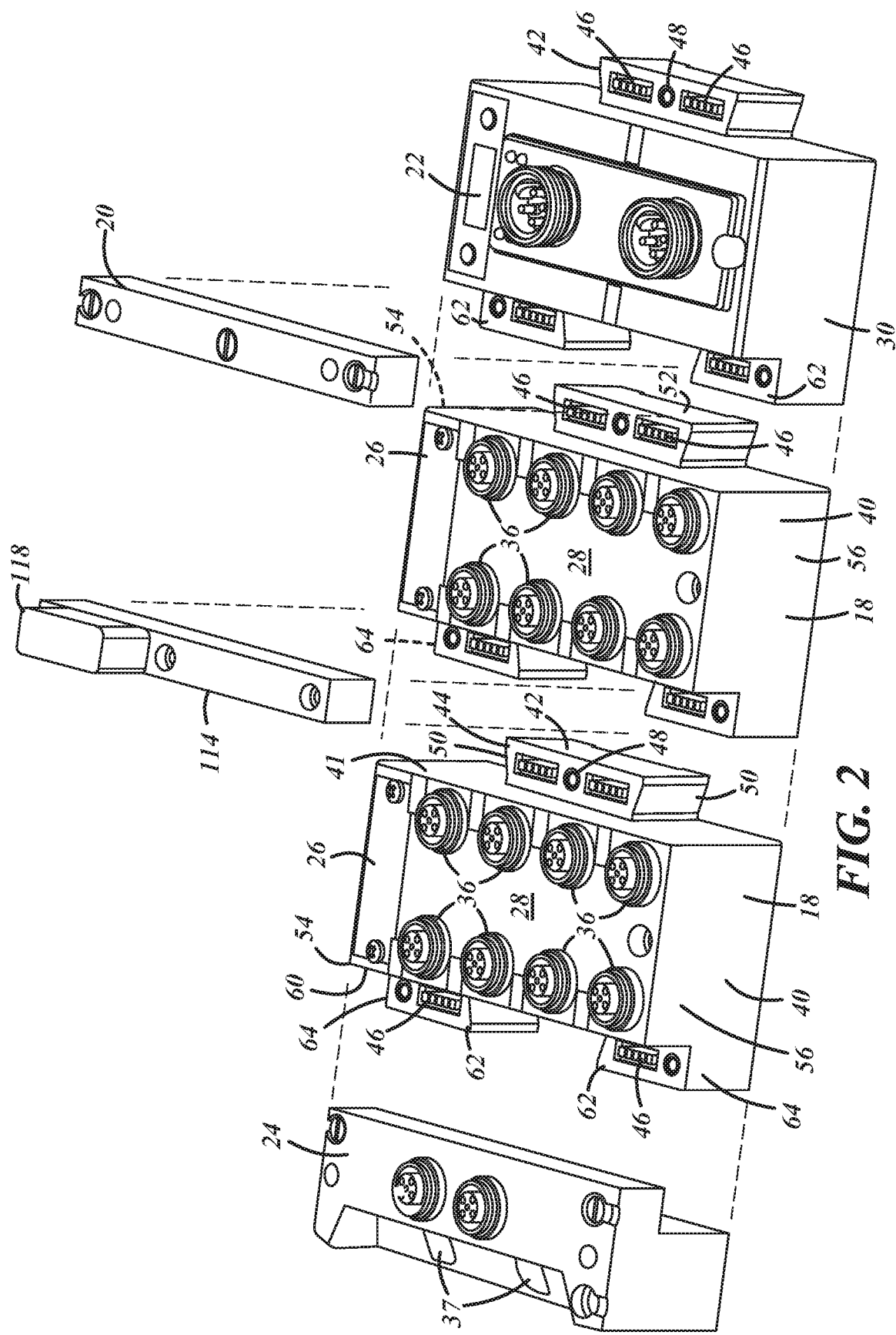
FIG. 2 is a partially exploded view of a bank with two I/O modules, a bus-out module, a communication module and wi-fi module shown in FIG. 1.

Referring now to FIGS. 1 and 2, one arrangement of an electrical fieldbus system 10 that is modular in nature and provides control for solenoid actuated valves 12 which are assembled together in a bank 16 and which controls directional flow in a valve manifold 14. The bank 16 has a communication module 30 with an alpha-numeric display 22 mounted thereon. The fieldbus system can also have a plurality of I/O modules 18 connected together via bridge members 20, (which are commonly referred to as clips) that bridge over and connect i.e. "clip together" two adjacent modules 18 and physically and electrically connect the I/O modules together with the communication module 30. The other side of the communication module 30 is connected to a valve driver module 32 which provides connection to and controls the solenoid valves 12.

Figure 3:
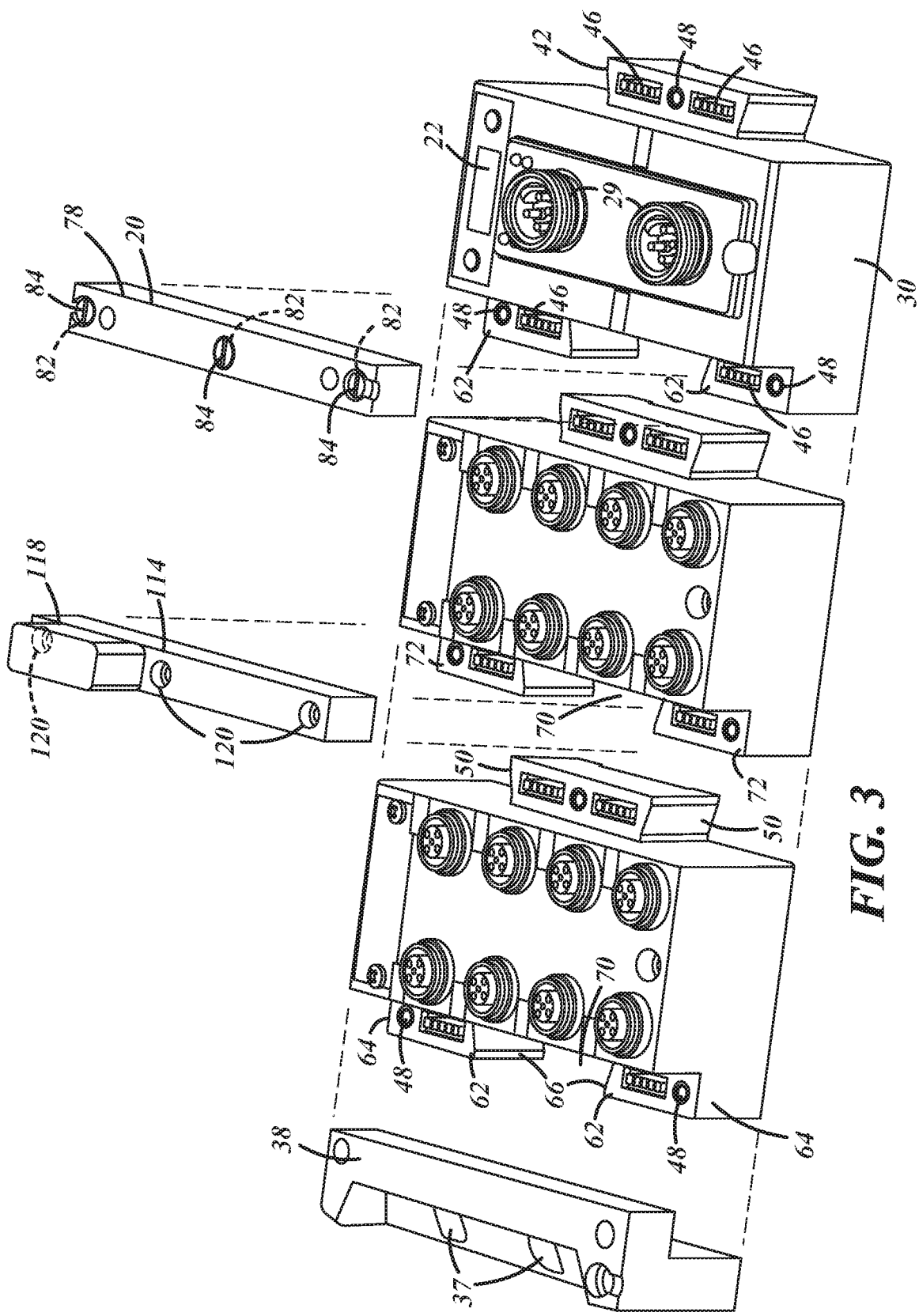
FIG. 3 is a view similar to FIG. 2 showing a endplate replacing the sub-bus module attached to the bank of I/O modules.

The I/O modules 18 and solenoid valves 12 may be banked and mounted to a DIN RAIL system 34 or directly to a backing plate 35. At one end of the bank 16, the modules 18 and communication module 30 interface with a bank of solenoids 12 and a valve manifold 14. The communication modules can be powered and communicate with other banks or an Ethernet network via cables 31 connected to fittings 29. The other end of the bank 16 of I/O modules has a bus-in, bus-out module 24 commonly referred to as a sub-bus module to connect to other substations via cables 33 connected to fittings 25 or, as shown in FIG. 3, the end of the bank 16 may have a terminating mounting plate 38. Both module 24 and plate 38 have apertures 37 suitable to receive a DIN compliant fastener for mounting to the DIN RAIL mounting rail 34.

Referring now to FIGS. 2 and 3, each I/O module 18 is has a housing 40 with an alpha-numeric graphical display 26 on the front main face 28 thereof. The front main face 28 also has a plurality of I/O connections or fittings 36. One side 41 of housing 40 has an interlocking extension 42 extending laterally. The interlocking extension 42 has a front face 44 recessed from main front face 28. The front face 44 has electrical fittings 46 and a central threaded insert 48. The shown interlocking extension may be dovetail in shape with angled side walls 50 and a straight end wall 52 parallel to side 41. The extension 42 is centrally located between the upper end 54 and lower end 56 of housing 40.

The other side 60 of housing 40 has two complementary shaped interlocking extensions 62 near the respective upper end 54 and lower end 56. The extensions have outer side walls 64 that are flush with respective upper and lower ends 54 and 56 of housing 40. Inner angled walls 66 are spaced appropriately to form a dove tail shaped cavity 70 to fit extension 42 of an adjacent module 18. Each extension 62 has a front face 72 that is also recessed with respect to main front face 28 in the same fashion as extension 42. Each extension 62 has an electrical fitting 46 and a threaded insert 48. The fittings 46 on each side and the I/O fittings and graphic display are all operably interconnected by an appropriate circuit board (not shown) mounted in interior of the housing 40.

Figure 4:
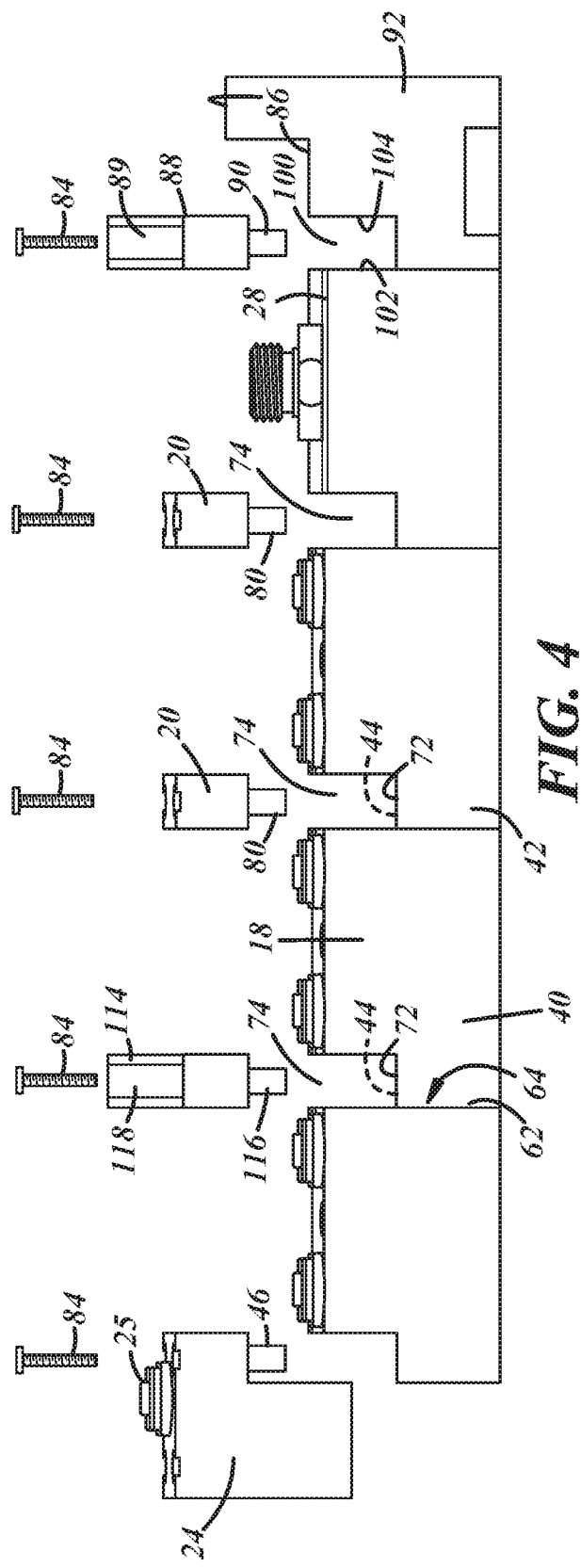
FIG. 4 is a partially exploded side elevation view of the adjacent I/O modules, communication module, and valve driver module with the automatic recovery module ARM clip and wi-fi module clip and optional end plate.
Figure 6:
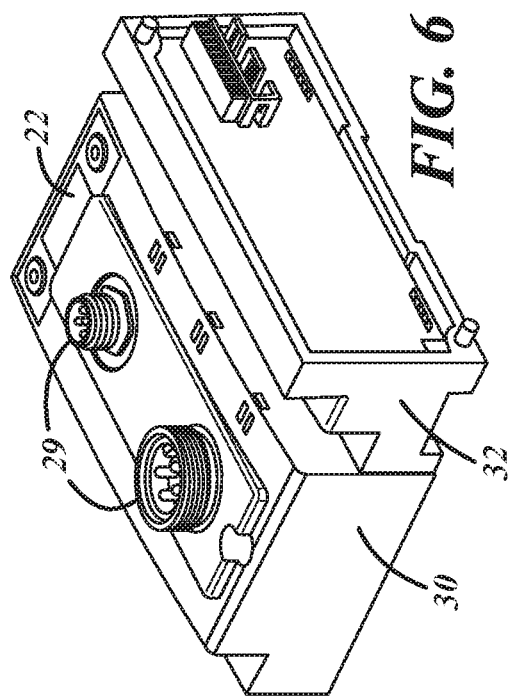
FIG. 6 is an enlarged perspective view of the communication module and valve drive module as shown in FIG. 1.

As shown in FIGS. 2 and 3, adjacent modules 18 fit together by vertically dropping or sliding one module with respect to another to laterally lock the modules together via the interlocking extension 42 and extensions 62. In other words, the two adjacent module housings 40 are locked together when they are seated on the DIN rail 34 shown in FIG. 1. A gap 74 as most clearly seen in FIG. 4 is then formed between the two adjacent housings 40 extending from main front faces 28 down to the vertically aligned front faces 44 and 72 of extensions 62 and extension 42. Each gap 74 receives clip 20 to connect two adjacent module housings 40 together and prevent the adjacent module housing 38 from lifting with respect to each other by being fastened into threaded inserts 48.

A standard clip 20 as shown more clearly in FIGS. 2, 3, and 4 has an elongated housing 78 with complementary electrical fittings 80 that each fit and connect to the fittings 46 in the extensions 42 and 62. In addition, each clip has apertures 82 aligned with threaded inserts 48 and fastened together with bolts 84. The clips 20 can be installed in each gap 74 to assemble the bank of I/O module housings 40, communication module 30 and valve drive module 32 and to electrically interconnect the I/O housings 40 with the communication module 30 and valve drive module 32.

The communication module 30 and valve drive module 32 have the same interconnection extensions 62 and 42 with fittings 46 and fastener inserts 48 as previously described before for the I/O housings 40 and can be similar attached together both electrically and mechanically via clip 20.

The interior of the module housing 40 is conventional in nature. The internal operational components e.g. circuit boards, (not shown) are operably connected to the electrical fittings 46, the alpha numeric display 22 and I/O fittings 76 in such a manner that when assembled communication with the clips 20, the electrical power and communication extends throughout the bank 16 and operably connected to communication module 30.

Furthermore, this construction provides for an intermediately positioned I/O module to be removed by removing bolts 86, lifting away clip 20. By removing adjacent clips 20, the extensions 42, 62 are exposed and a module housing 40 can be lifted out. A replacement I/O module 18 can be positioned in the space provided without moving the other I/O modules 18. Optionally, the other I/O modules can be moved together and joined together through the interlocking connection eliminating the space left by the removed I/O module. Furthermore, if an additional I/O module 18 is needed, the sub-bus module 24 or end plate 38 can be temporarily removed, to form a space where an additional module 18 can then be introduced and the sub-bus module 24 or end plate 38 can be re-connected to complete the mechanical, electrical and ground connection. Furthermore, in similar fashion, an additional module 18 can be introduced between two other adjacent modules 18. Likewise, communication module 30 can be replaced if needed via removal of a clips 20 at each side.

Similarly, optional wi-fi modules and automatic recovery modules may be added in the above described fashion. However, many of the banks of valve modules have been initially fitted within tightly dimensioned cabinets or within tight spaces. Linear increasing of the bank is often impossible but yet an operator may still have the need or desire to add functions for example, an automatic recovery feature or wi-fi without the need to replace the entire bank 16.

Figure 11:
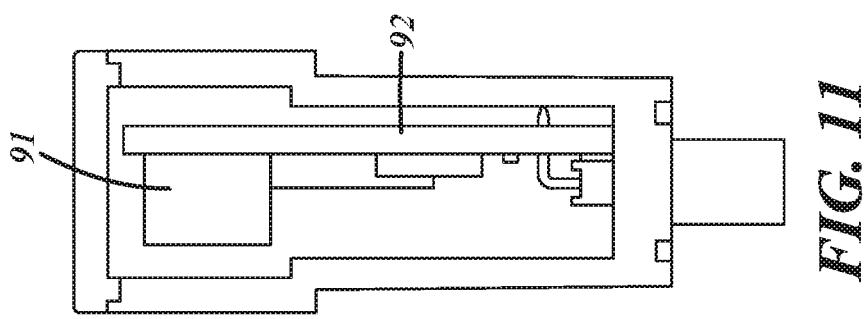
FIG. 11 is a bottom plan view of an alternate automatic recovery module clip.
Figure 10:
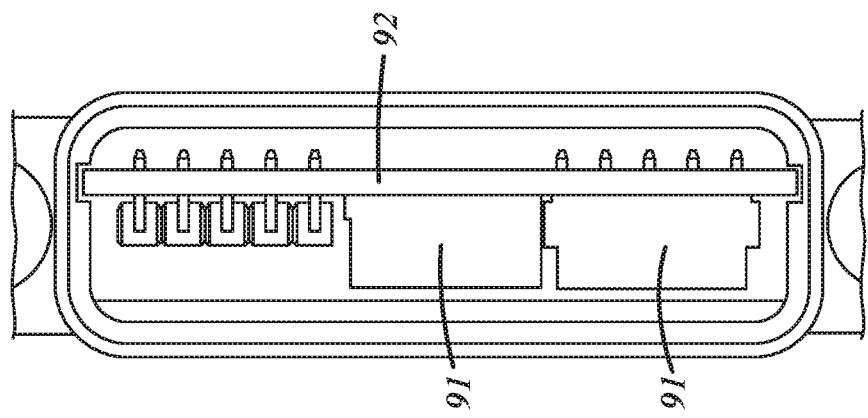
FIG. 10 is a bottom plan view of the automatic recovery module clip shown in FIG. 6.

For example, with reference to the FIGS. 1, 4 and 7, if an automatic recovery feature is desired, the clip 20 that was initially mounted between the communication module 30 and valve drive module 32 can be replaced with an automatic recovery module (ARM) 88. The ARM 88 has a housing that has fittings 90 similarly constructed to fittings 80 of clip 20 that fit and mount to fittings 46 between the communication module 30 and valve drive module 32. The fittings 90 operably connect the fittings of the communication module 30 to the valve drive module 32 through the interior of the ARM 88. The ARM 88 may have an protrusion section 89 to provide the needed interior space for housing the functional components. The interior of the ARM 88 as shown in FIG. 10 or 11 has a circuit board 92 which has relays 91 and non-volatile memory storage (not shown) on the circuit board 92 to provide the functional automatic recovery upon each start-up or change of set up parameters in the bank 16 also connected to the circuitry that goes to the fittings 90. The ARM also has apertures 94 that receive bolts 84 that attach to threaded inserts 48 of the communication module 30 and valve drive module 32 to complete the installation of the ARM 88 onto the communication module 30 and valve driven module 32.

The ARM 88 unlike conventional ARM's does not need to have the communication module 30 separated or spaced from the valve drive module 32. As such, ARM 88 nests or piggybacks onto the communication module 30 and the valve drive module 32 within gap 100 between the upright side walls 102 and 104 of the communication module 30 and valve drive module 32. Unlike conventional ARMs, ARM 88 does not attach to the DIN rail 34 but sits atop the other communication module 30 and valve driven module 32 and is seated in the gap 100 on top of front faces 44 and 72 between the main front face 28 of communication module 30 and the higher stepped portions 86 of valve drive module 32.

Figure 12:
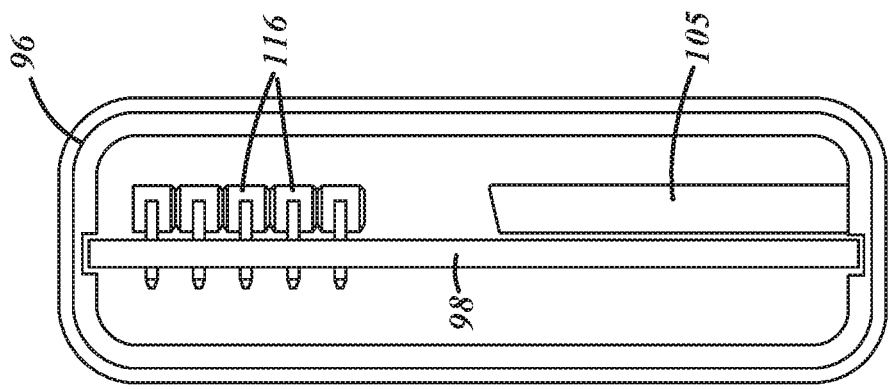
FIG. 12 is a bottom plan view of the wireless wi-fi end plate module shown in FIG. 8.

Similarly, if a wi-fi functionality is desired to be added to the bank 16, one can replace the end plate 38 at the left side as shown in FIG. 3 with a wi-fi module 96 as shown in FIGS. 8 and 9. The wi-fi module 96 has a similar protrusion section 97 to create the needed interior space for the functional components. Its interior, as shown in FIG. 12, has a circuit board 98 with transmitter and receiver 105 operably connected to its fittings 106. The fittings 106 are generally connected and can be mounted to the electrical fittings 46 of the left most module housing 40 as shown in FIG. 3. The wi-fi module 96 has apertures 108 aligned with the threaded inserts 48 of the left most module housing 40 for mounting the module 96 to the module housing 40. The wi-fi module 96 also has apertures 110 that receive DIN rail compliant fasteners (not shown) for mounting to the DIN rail 34. A third set of apertures 112 is used to attach the module 96 directly to a backing plate 35 with screws or bolts (not shown) if there is no DIN rail 34. The wi-fi module 96 does not add to the length of the bank 16 when replacing a conventional end plate 38. This is, in-part due to connecting of the electrical fittings 46 and using the space above the front face 44 of housing 40.

Figure 5:
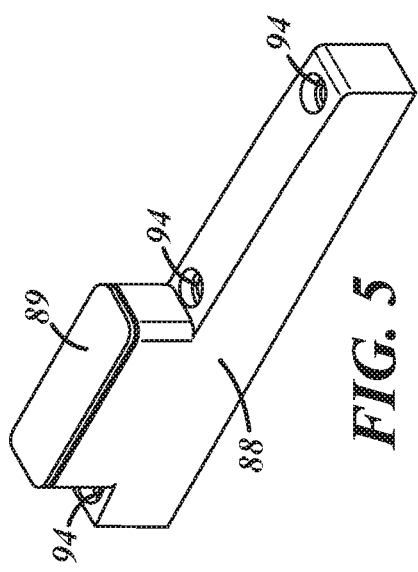
FIG. 5 is an enlarged perspective view of the ARM clip shown in FIG. 1.

In certain applications, the sub-bus module 24 needs to remain but a wi-fi capability is still needed or desired for bank 16. In this application, a clip 20 that is used between two modules 18 can be replaced with a alternate wi-fi module 114 as shown in FIGS. 1-4. The exterior of the wi-fi module 114 may look identical with the ARM 88 and thus the perspective view is not shown separately but reference can be made to FIG. 5. In this application, the wi-fi module has electrical fittings 116 that connect with the electrical fitting 46 between two adjacent module housings 40. The module 114 has a protrusion section 118 The interior of the wi-fi housing has within it interior a circuit board 120 with transmitter and receiver 105 operably connected to its fittings 116. The electrical fittings 116 are operably mounted to fittings 46 on the complementary interlocking extensions 42, 62 of two adjacent module housings 40. Like the ARM module 88, the wi-fi module 114 nests or piggybacks onto the two adjacent module housings 40 and does not attach to the DIN rail 34 but sits atop the adjacent module housings 40 and is seated in the gap 74 on top of front faces 44 and 72 between the main front faces 28 of adjacent module housings 40 and attached through apertures 120 to threaded inserts 48.

In this fashion, functional components, for example ARMs or wi-fi modules can be added to the presently existing bank 16 without adding length to the bank 16 or replacement of the modules housings 40, main communication module 30 or valve drive module 32.

The removal and replacement of the standard clip 20 with a ARM 88 or wi-fi module 96, 114 is expeditiously accomplished. Secondly the wi-fi module 114 and the ARM 88 doubles as a clip when properly installed to lock the I/O module housings 40, communication module 30 and valve driver module 32 together.

Other variations and modifications are possible without departing from the scope and spirit of the present invention as defined by the appended claims.

The embodiments in which an exclusive property or privilege is claimed are defined as follows:

1. A modular electrical fieldbus assembly comprising:
    a bank of modules mounted adjacent each other, said modules each having an electrical fitting in proximity to each side thereof for electrically connecting two adjacent modules together;
    a bridge member spanning and electrically and mechanically connecting two adjacent modules together; and
    a functional module spanning and electrically and mechanically connecting two adjacent modules together;
    wherein said functional module comprises at least one non-volatile memory or wi-fi transmitting and receiving device; and
    wherein said functional module has a width that is less than or equal to a width of said bridge member.

2. A modular electrical fieldbus assembly as defined in claim 1, wherein:
    said functional module has a plurality of complementary electrical fittings for fitting with electrical fittings of only said two adjacent modules and for mechanically connecting said two adjacent modules together.

3. A modular electrical fieldbus assembly as defined in claim 2, wherein:
    said functional module has a wireless gateway operably mounted therein and operably connected to said complementary electrical fittings for receiving electrical communication therefrom and wirelessly transmitting said electrical communication to a remote receiving device and for transmitting electrical communication to said complementary electrical fittings received from a remote wireless transmitting device, the wireless gateway including said wi-fi transmitting and receiving device.

4. A modular electrical fieldbus assembly as defined in claim 1, wherein:
    each module has one side with a first extension and an opposite side with another extension that has a cavity that interlocks with the first extension; and
    said functional module is disposed and aligned directly in front of the two adjacent modules and the interlocking extensions and interlocking cavity and secured thereto to mechanically connect said two adjacent modules together.

5. A modular electrical fieldbus assembly as defined in claim 4, wherein:
    said first extension and said another extension of each module includes recessed front faces with respect to a main face of each module;
    said electrical fittings are housed within said extensions and are interposed laterally between two main faces of two adjacent modules; and
    said functional module is disposed in a gap directly in front of the recessed front faces between the main faces of said two adjacent modules to mechanically connect and affix to both of said two adjacent modules and positioned directly in front of said recessed front faces of said extensions.

6. A modular electrical fieldbus assembly as defined in claim 1, wherein:
    said functional module includes the non-volatile memory.

7. A modular electrical fieldbus assembly as defined in claim 1, wherein:
    said functional module includes an automatic recovery module, and the automatic recovery module includes the non-volatile memory.

8. A modular electrical fieldbus assembly as defined in claim 1, wherein:
    said functional module includes the wi-fi transmitting and receiving device.

9. A modular electrical fieldbus assembly as defined in claim 1, further comprising:
    a DIN rail, wherein the bank of modules are connected to the DIN rail and the functional module is not connected to the DIN rail.

10. A modular electrical fieldbus assembly comprising:
    a first module and a second module juxtaposed against each other and having opposing sides with complementary shaped sections to interlock together along a plane;
    a functional modular member mountable on said first and second modules directly in front of said complementary shaped sections to fasten and connect said modules together in a direction perpendicular to said plane;
    said modules and said functional modular member having complementary electrical fittings to electrically connect modules together through said functional modular member; and
    said functional modular member including at least one non-volatile memory or wireless gateway operably connected to said complementary electrical fittings.

11. A modular electrical fieldbus assembly as defined in claim 10, wherein:
    said functional modular member includes the non-volatile memory.

12. A modular electrical fieldbus assembly as defined in claim 11, wherein:
    said functional modular member includes an automatic recovery module, and the automatic recovery module includes the non-volatile memory.

13. A modular electrical fieldbus assembly as defined in claim 10, wherein:
    said functional modular member includes the wireless gateway.

14. A modular electrical fieldbus assembly as defined in claim 10, wherein:
    the first and second modules have side extensions with recessed front faces with respect to a main face of each module;
    said side extensions house electrical fittings that are interposed between the main faces of the first and second modules; and
    said functional modular member is disposed in a gap in front of the recessed front faces between the main faces of the first and second modules to mechanically connect and affix to both of the first and second modules.

15. A method of reconfiguring a modular electrical fieldbus assembly having a bank of modules mounted adjacent each other, and a bridge member spanning and electrically and mechanically connecting at least two adjacent modules together, the two adjacent modules including an I/O module, the method comprising:

removing the bridge member from said two adjacent modules; and installing a functional module in place of the removed bridge member, the functional module spanning and electrically and mechanically connecting said two adjacent modules together, the functional module including at least one non-volatile memory or wi-fi transmitting and receiving device.

16. The method as defined in claim 15, wherein:

said functional module includes the non-volatile memory.

17. The method as defined in claim 16, wherein:

said functional module includes an automatic recovery module, and the automatic recovery module includes the non-volatile memory.

18. A method of reconfiguring a modular electrical fieldbus assembly having a bank of modules mounted adjacent each other, and a bridge member spanning and electrically and mechanically connecting at least two adjacent modules together, the method comprising:

removing the bridge member from said two adjacent modules; and installing a functional module in place of the removed bridge member, the functional module spanning and electrically and mechanically connecting said two adjacent modules together, the functional module including at least one wi-fi transmitting and receiving device.

19. The method as defined in claim 17, wherein:

said functional module has a width that is less than or equal to a width of the bridge member.

\* \* \* \* \*